US011162998B2

(12) United States Patent
Giordano et al.

(10) Patent No.: US 11,162,998 B2
(45) Date of Patent: Nov. 2, 2021

(54) CIRCUIT FOR DETECTION AND WARNING OF ELECTRO-MIGRATION ON A PRINTED CIRCUIT BOARD

(71) Applicant: Lear Corporation, Southfield, MI (US)

(72) Inventors: Federico Giordano, Valls (ES); Antoni Ferré Fàbregas, Valls (ES); Ignacio Molinero Horno, Valls (ES); Francisco Javier Pérez Fernández, Valls (ES)

(73) Assignee: LEAR CORPORATION, Southfield, MI (US)

( * ) Notice: Subject to any disclaimer, the term of this patent is extended or adjusted under 35 U.S.C. 154(b) by 210 days.

(21) Appl. No.: 16/558,538

(22) Filed: Sep. 3, 2019

(65) Prior Publication Data

US 2021/0063472 A1  Mar. 4, 2021

(51) Int. Cl.
*G01R 31/08* (2020.01)
*G01R 31/28* (2006.01)
*G01R 31/50* (2020.01)

(52) U.S. Cl.
CPC ........... *G01R 31/281* (2013.01); *G01R 31/50* (2020.01)

(58) Field of Classification Search
CPC .............. G01R 31/281; G01R 31/2812; G01R 31/2817; G01R 31/2818; G01R 31/2806; G01R 31/50; G01R 31/52; G01R 31/08; G01R 31/025; G01R 31/11
See application file for complete search history.

(56) References Cited

U.S. PATENT DOCUMENTS

| | | | |
|---|---|---|---|
| 6,924,651 B2 * | 8/2005 | Osaka | G01R 31/11 324/628 |
| 7,154,278 B2 | 12/2006 | Scholl et al. | |
| 7,324,373 B2 | 1/2008 | Shimada | |
| 9,098,761 B2 | 8/2015 | Delorme | |
| 2011/0255253 A1 | 10/2011 | Campbell et al. | |
| 2015/0066399 A1 * | 3/2015 | Kasai | G01R 31/14 702/58 |
| 2015/0219713 A1 * | 8/2015 | Aoyama | G01R 31/2818 324/763.01 |
| 2017/0013709 A1 * | 1/2017 | Matsumoto | H05K 1/181 |
| 2018/0128870 A9 * | 5/2018 | Shibata | G01R 31/2817 |
| 2020/0343200 A1 * | 10/2020 | Kim | H01L 23/58 |

* cited by examiner

*Primary Examiner* — Thang X Le
(74) *Attorney, Agent, or Firm* — Brooks Kushman P.C.

(57) ABSTRACT

A circuit for detection and warning of electro-migration in a region on a printed circuit board between a first electrically conductive element having a first electrical characteristic and a second electrically conductive element having a second electrical characteristic different than the first. The circuit includes an electrically conductive guard track that is electrically isolated from the first and second elements in the region and has a normal condition electrical characteristic based on the first and second characteristics. The circuit includes an electrical characteristic supervisor to detect an electrical characteristic of the guard track. In response to electro-migration creating an electrical connection of the guard track to the first or second element, the guard track has an abnormal condition electrical characteristic different than the normal condition. In response to detecting the abnormal condition of the guard track, the supervisor effectuates a warning of electro-migration in the region.

20 Claims, 3 Drawing Sheets

CIRCUIT FOR DETECTION AND WARNING OF ELECTRO-MIGRATION ON A PRINTED CIRCUIT BOARD

TECHNICAL FIELD

The following relates to a circuit for detection and warning of electro-migration in a region on a printed circuit board between electrically conductive elements.

BACKGROUND

In devices or applications utilizing printed circuit boards (PCBs), such as a vehicle body control module (BCM), gateway module, smart junction box (SJB), or the like, electro-migration can cause unintended electrical connections between different tracks, elements, portions, or the like of the PCB, such as between a battery voltage (VBAT) area and a ground (GND) area, which may result in a short circuit. Such electro-migration and unintended electrical connections may occur, for example, in an ambient environment having a high temperature and/or a high humidity and is also dependent on inter-track distances and voltage differences.

Current PCBs may be designed such that distances between tracks or the like are increased to potentially reduce the occurrence of electro-migration connections. However, such a technique can increase PCB manufacturing costs if the size or area of the PCB must consequently be increased to accommodate the circuitry required. Alternatively, the thickness of a varnish cover applied to current PCBs may be increased to potentially reduce the occurrence of electro-migration connections. However, such a technique can also result in increased PCB manufacturing costs. Moreover, such techniques do nothing to detect or warn of the occurrence of electro-migration connections.

A need therefore exists for a system that improves robustness against such electro-migration and short circuit anomalies. Such an improved system would detect electro-migration and unintended electrical connections and would ideally also generate a warning before a short circuit occurs. By generating an early warning, such an improved system would mitigate and/or reduce short circuit effects, thereby avoiding risks associated with thermal events. Early warning provided by such an improved system may reduce short circuit effects and/or prevent the risk of thermal events because the part involved can be serviced before a full short circuit is generated.

SUMMARY

According to one non-limiting exemplary embodiment described herein, a circuit is provided for detection and warning of electro-migration in a region on a printed circuit board between a first electrically conductive element and a second electrically conductive element, the first conductive element having a first electrical characteristic and the second conductive element having a second electrical characteristic different than the first electrical characteristic. The circuit comprises an electrically conductive guard track located in the region between the first and second electrically conductive elements, wherein the guard track is electrically isolated from the first and second elements in the region between the first and second elements, and wherein the guard track has a normal condition electrical characteristic based on the first and second electrical characteristics. The circuit further comprises an electrical characteristic supervisor in electrical communication with the guard track and configured to detect an electrical characteristic of the guard track. In response to electro-migration creating an electrical connection of the guard track to the first or second element, the guard track has an abnormal condition electrical characteristic different than the normal condition electrical characteristic. In response to detecting the abnormal condition electrical characteristic of the guard track, the electrical characteristic supervisor is further configured to effectuate a warning of electro-migration in the region between the first and second electrically conductive elements.

According to another non-limiting exemplary embodiment described herein, a circuit is provided for detection and warning of electro-migration in a region on a printed circuit board between a first electrically conductive element and a second electrically conductive element. The circuit comprises a first electrically conductive guard track located in the region between the first and second elements, wherein the first guard track is electrically isolated from the first and second elements, and a second electrically conductive guard track located in the region between the first and second elements, wherein the second guard track is electrically isolated from the first and second elements. The circuit further comprises an electrical characteristic generator in electrical communication with the first guard track and configured to generate a reference electrical characteristic, and an electrical characteristic supervisor in electrical communication with the second guard track and configured to detect an electrical characteristic of the second guard track, wherein the second guard track has a normal condition electrical characteristic based on the reference electrical characteristic. In response to electro-migration creating an electrical connection of the first element to the first guard track or creating an electrical connection of the second element to the first guard track or creating an electrical connection of the first element to the second guard track or creating an electrical connection of the second element to the second guard track, the second guard track has an abnormal condition electrical characteristic different than the normal condition electrical characteristic. In response to detecting the abnormal condition electrical characteristic of the guard track, the electrical characteristic supervisor is further configured to effectuate a warning of electro-migration in the region between the first and second electrically conductive elements.

A detailed description of these and other non-limiting exemplary embodiments of a circuit for detection and warning of electro-migration in a region on a printed circuit board between electrically conductive elements is set forth below together with the accompanying drawings.

DETAILED DESCRIPTION

As required, detailed non-limiting embodiments are disclosed herein. However, it is to be understood that the disclosed embodiments are merely exemplary and may take various and alternative forms. The figures are not necessarily to scale, and features may be exaggerated or minimized to show details of particular components, elements, features, items, members, parts, portions, or the like. Therefore, specific structural and functional details disclosed herein are not to be interpreted as limiting, but merely as a representative basis for teaching one skilled in the art.

With reference to the Figures, a more detailed description of non-limiting exemplary embodiments of a circuit for detection and warning of electro-migration in a region on a printed circuit board between electrically conductive elements will be provided. For ease of illustration and to facilitate understanding, like reference numerals have been used herein for like components and features throughout the drawings.

Figure 1:
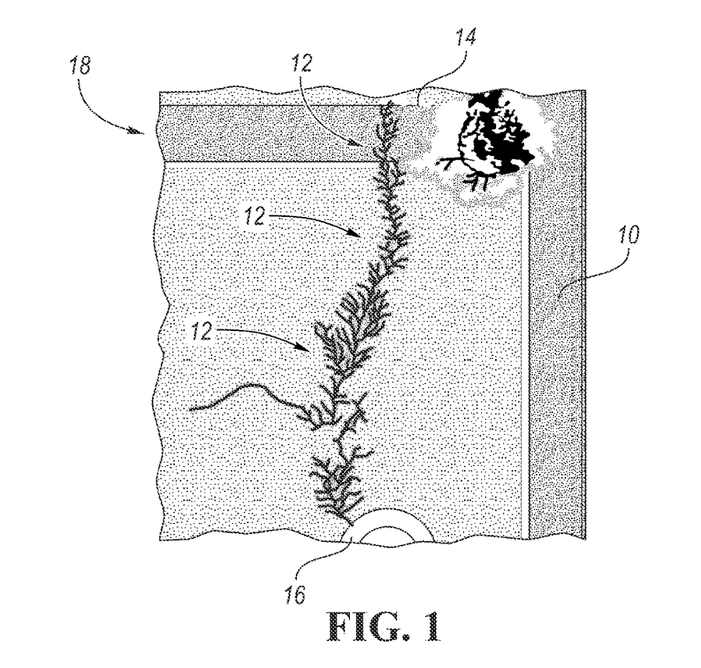
FIG. 1 is an illustration of printed circuit board having an exemplary electro-migration short.

In that regard, FIG. 1 illustrates a printed circuit board (PCB) 10 having an exemplary electro-migration short 12. As seen therein different electrically conductive tracks, elements, portion, or the like 14, 16 are configured to be separated and electrically isolated from each other on the PCB 10 by an electrically non-conductive or insulative area or space 18. As previously described, electro-migration can cause, create, or form an unintended electrical connection 12 between the different electrically conductive tracks, elements, portions, or the like 14, 16 across the area or space 18, which unintended electrical connection 12 may result in a short circuit. Such electro-migration and unintended electrical connection 12 may occur, for example, in an ambient environment having a high temperature and/or a high humidity and is also dependent on the inter-track distance and the voltage difference therebetween. Therefore, having a minimum distance as a guideline, the greater the voltage difference, the greater the risk of electromigration formation. For the same reasons, the greater risk for electromigration formation is in gaps, areas, space, or regions between battery and ground tracks.

As also previously described, current PCBs 10 may be designed such that the distance between the electrically conductive tracks or the like 14, 16 across the area or space 18 is increased to potentially reduce the occurrence of an electro-migration connection 12. Alternatively, the thickness of a varnish cover applied to current PCBs 10 may be increased to potentially reduce the occurrence of an electro-migration connection 12. However, such techniques can result in increased PCB manufacturing costs and do nothing to detect or warn of the occurrence of an electro-migration connection 12.

A need therefore exists for a system that improves robustness against such electro-migration and short circuit anomalies. Such an improved system would detect electro-migration and unintended electrical connections and would ideally also generate a warning before a short circuit occurs. By generating an early warning, such an improved system would mitigate and/or reduce short circuit effects, thereby avoiding risks associated with thermal events. Early warning provided by such an improved system may reduce short circuit effects and/or prevent the risk of thermal events because the part involved can be serviced before a full short circuit is generated.

Figure 2:
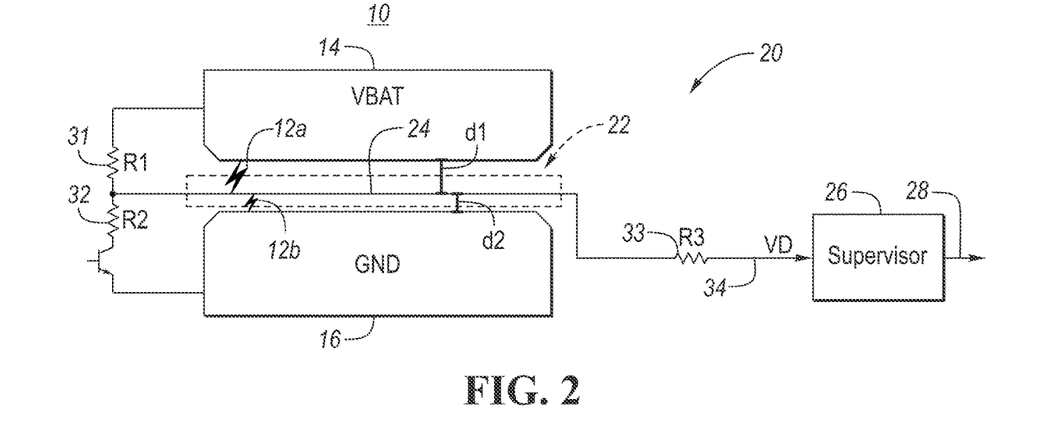
FIG. 2 is simplified schematic diagram of a circuit for detection and warning of electro-migration in a region on a printed circuit board between electrically conductive elements according to a non-limiting exemplary embodiment of the present disclosure.

Referring now to FIG. 2, a simplified schematic diagram is shown of a circuit 20 for detection and warning of electro-migration in a region on a PCB 10 between electrically conductive elements according to a non-limiting exemplary embodiment of the present disclosure. As seen therein, the circuit 20 is provided for detection and warning of electro-migration in an area, space, or region 22 on the PCB 10 between a first electrically conductive element 14 and a second electrically conductive element 16, the first conductive element 14 having a first electrical characteristic and the second conductive element 16 having a second electrical characteristic different than the first electrical characteristic.

The circuit 20 may comprise an electrically conductive signal or guard track 24 located in the region 22 between the first 14 and second 16 electrically conductive elements. In that regard, it should be noted that the region 22 as illustrated in FIG. 2 is provided for ease of understanding only, and that the region 22 may comprise all or any portion or part of the space or area between the first 14 and second 16 electrically conductive elements.

The guard track 24 is electrically isolated from the first 14 and second 16 electrically conductive elements in the region 22 between the first 14 and second 16 electrically conductive elements. As seen in FIG. 2, the guard track 24 may be provided in electrical communication with the first 14 and second 16 electrically conductive elements outside the region 22 between the first 14 and second 16 electrically conductive elements. In the absence of an electro-migration connection 12a occurring between the guard track 24 and the first electrically conductive element 14 and an electro-migration connection 12b occurring between the second electrically conductive element 16, the guard track 24 may thus have a normal condition electrical characteristic based on the respective first and second electrical characteristics of the first 14 and second 16 electrically conductive elements.

The circuit 20 may further comprise an electrical characteristic supervisor 26 in electrical communication with the guard track 24 and configured to detect an electrical characteristic of the guard track 24. In that regard, in response to electro-migration creating an electrical connection 12a of the guard track 24 to the first electrically conductive element 14 and/or an electrical connection 12b of the guard track 24 to the second electrically conductive element 16, the guard track 24 has an abnormal condition electrical characteristic different than the normal condition electrical characteristic. In response to detecting the abnormal condition electrical characteristic of the guard track 24, the electrical characteristic supervisor 26 is further configured to effectuate a warning to a user (e.g., a vehicle driver or vehicle diagnostics technician) of electro-migration in the region 22 between the first 14 and second 16 electrically conductive elements, which may comprise outputting a signal 28. In that regard, such a warning and/or signal 28 may be of any type or take any form, such as a message transmitted through a communication interface (not shown), a Diagnostic Trouble Code (DTC) stored in a Non-Volatile Memory (NVM) (not shown), a signal generating such a DTC or causing such a DTC to be generated, or a signal storing such a DTC in NVM or causing such a DTC to be stored in NVM.

Still referring to FIG. 2, the guard track 24 may be located in the region 22 between the first 14 and second 16 electrically conductive elements such that the distance d1 between the guard track 24 and the first electrically conductive element 14 differs from the distance d2 between the guard track 24 and the second electrically conductive element 16. In that regard, asymmetric distances d1, d2 between the guard track 24 and the first 14 and second 16 electrically conductive elements makes the occurrence of simultaneous shorts between the first electrically conductive element 14 and the guard track 24 (VBAT-track) and between the guard track 24 and the second electrically conductive element 16 (track-GND) more difficult, and also compensates for the effect of the electrical parameters configuration, such as a voltage difference value between the guard tracks 24 and the positive 14 or the negative 16 tracks. For example, in a 12V scenario, if the voltage in the guard track 24 is 5V, it may be preferable to locate the guard track 24 closer to the positive track 14 than to the negative track 16. Alternatively, however, the guard track 24 may be located in the region 22 equidistant from the first 14 and second 16 electrically conductive elements.

As depicted in in FIG. 2, the first electrically conductive element 14 may comprise a voltage supply, such as a battery voltage supply area (VBAT) on the PCB 10. The second electrically conductive element 16 may comprise a ground, such as a ground area (GND) on the PCB 10. It should be noted, however, that alternatively the first 14 and second 16 electrically conductive elements may both or individually comprise any type of electrically conductive element, such as an electrically conductive portion, line, lead, trace, track, node, or via. In that regard, where the first eclectically conductive element 14 comprises an electrically conductive via, the electrically conductive guard track 24 may be configured as a ring surrounding the via and the second electrically conductive element 16 may be configured to surround both the guard track 24 and the via, with electrical connections for the guard track ring 24 and the electrically conductive via element 14 configured at another layer of the PCB 10.

As also depicted in FIG. 2, the electrical characteristic of the first 14 and second 16 electrically conductive elements may comprise voltage, and the electrical characteristic supervisor 26 may comprise a voltage supervisor or detector. In that same regard, the first electrical characteristic of the first electrically conductive element 14 may comprise a first voltage, and the second electrical characteristic of the second electrically conductive element may comprise a second voltage. Further, the normal condition electrical characteristic of the guard track 24 may comprise a normal condition voltage, and the abnormal condition electrical characteristic of the guard track 24 may comprise an abnormal condition voltage. In that regard, the normal condition voltage in the guard track 24 (and thus voltage differences between the guard track 24 and the first 14 and second 16 electrically conductive elements) is set by design and is not related to distances d1, d2, both of which are independent parameters in electromigration anomaly.

It should be noted, however, that the electrical characteristic of the first 14 and second 16 electrically conductive elements may comprise voltage, while alternatively the electrical characteristic supervisor 26 may comprise a current supervisor or detector. In that regard, the first electrical characteristic of the first electrically conductive element 14 may comprise a first voltage, and the second electrical characteristic of the second electrically conductive element may comprise a second voltage. Further, the normal condition electrical characteristic of the guard track 24 may comprise a normal condition current, and the abnormal condition electrical characteristic of the guard track 24 may comprise an abnormal condition current. In that regard, in the case of a complex signal generated in the guard track 24 (instead of a basic voltage divider), with a set of impedances (not only resistors), electromigration might affect signal frequency or shape as well. Furthermore, any of the resistors R1 31, R2 32, and R3 33 shown in FIG. 2 and described in connection therewith, may alternatively be capacitors for example, or impedances more generally.

Referring still to FIG. 2, the circuit 20 may further comprise one or more resistors, R1 31, R2 32, and R3 33. As seen therein, resistor R1 31 and R2 32 may be configured as a voltage divider to produce a desired normal condition voltage of the guard track 24, i.e., the voltage of the guard track 24 in the absence of an electro-migration connection 12a occurring between the guard track 24 and the first electrically conductive element 14 and an electro-migration connection 12b occurring between the guard track 24 and the second electrically conductive element 16. In that regard, to reduce electro-migration between the first 14 and second 16 electrically conductive elements, the normal condition voltage of the guard track 24 may implemented as an intermediate voltage, i.e., less than the first voltage of the first electrically conductive element 14 and greater than the second voltage of the second electrically conductive element 16.

As previously described, the electrical characteristic supervisor 26 is configured to detect an electrical characteristic of the guard track 24. In the absence of an electro-migration connection 12a occurring between the guard track 24 and the first electrically conductive element 14 and an electro-migration connection 12b occurring between the guard track 24 and the second electrically conductive element 16, the electrical characteristic supervisor 26 detects the normal condition characteristic of the guard track 24. In response to electro-migration creating an electrical connection 12a of the guard track 24 to the first electrically conductive element 14 and/or an electrical connection 12b of the guard track 24 to the second electrically conductive element 16, the electrical characteristic supervisor 26 detects an abnormal condition electrical characteristic of the guard track 24 different than the normal condition electrical characteristic of the guard track 24. As seen in FIG. 2, where the electrical characteristic is depicted as voltage, the electrical characteristic supervisor 26 detects voltage VD 34 of the guard track 24, which may be the normal condition voltage or an abnormal condition voltage of the guard track 24, depending on the absence or presence of an electro-migration connection 12a, 12b. In that regard, implemented as shown in FIG. 2, where the electrical characteristic comprises voltage, the normal condition voltage may be determined as $VD_n=VBAT*R2/(R1+R2)$, where it is assumed that R3 and the input impedance of supervisor 26 have no significant effect.

As also previously described, in response to detecting the abnormal condition electrical characteristic of the guard track 24, the electrical characteristic supervisor 26 is further configured to effectuate a warning to a user of electro-migration in the region 22 between the first 14 and second 16 electrically conductive elements, which may comprise outputting a signal 28. Thus, any electro-migration in the region 22 between the first 14 and second 16 electrically conductive elements will change the impedance balance at VD, thus enabling a warning signal to be generated prior to the occurrence of a complete short-circuit.

Figure 3A:
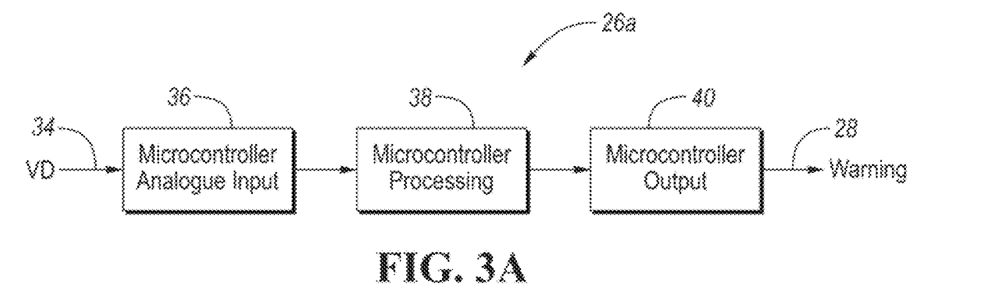
FIG. 3A is a simplified block diagram of an electrical characteristic supervisor for a circuit for detection and warning of electro-migration in a region on a printed circuit board between electrically conductive elements according to a non-limiting exemplary embodiment of the present disclosure.
Figure 3B:
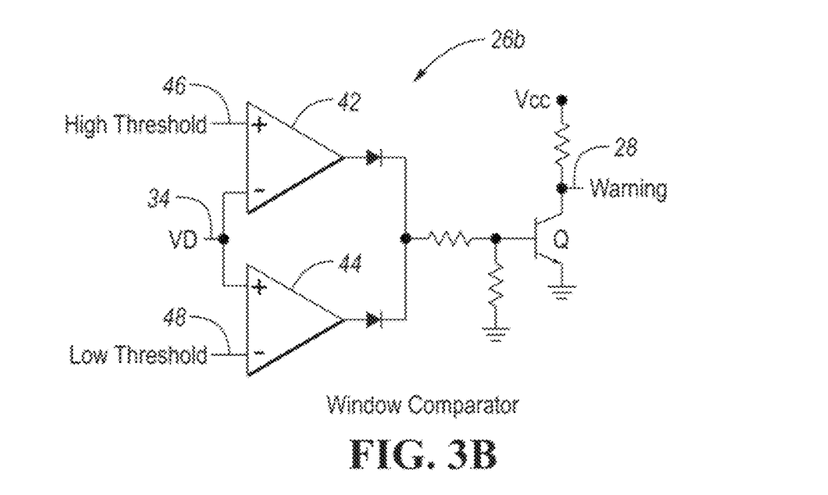
FIG. 3B is a simplified schematic diagram of an electrical characteristic supervisor for a circuit for detection and warning of electro-migration in a region on a printed circuit board between electrically conductive elements according to a non-limiting exemplary embodiment of the present disclosure.

FIGS. 3A and 3B are simplified block and schematic diagrams of electrical characteristic supervisors 26 for a circuit 20 for detection and warning of electro-migration in a region 22 on a PCB 10 between electrically conductive elements 14, 16 according to non-limiting exemplary embodiments of the present disclosure. As seen in FIG. 3A, the electrical characteristic supervisor 26 may comprise a microcontroller 26a comprising a microcontroller analog input 36, a microcontroller processor 38, and a microcontroller output 40. The microcontroller analog input 36 may be configured to receive the detected voltage VD 34 (see FIG. 2) and output a digital signal representative thereof, or send a signal or message through a communication interface (not shown), or store a Diagnostic Trouble Code (DTC) in a Non-Volatile Memory (NVM) (not shown). The microcontroller processor 38, which may include associated memory and stored computer executable instructions, which may include stored operating system software and/or application software executable by the processor(s) for controlling operation thereof, performing the particular algorithm or algorithms represented by the various functions and/or operations described herein, including interaction and/or cooperation with other components, may be configured to perform processing operations such as comparing the digital signal representative of the detected voltage VD 34 to the desired or expected normal condition voltage. In that regard, when the detected voltage VD 34 differs from the expected normal condition voltage, the detected voltage VD 34 may represent an abnormal condition voltage indicative of an electro-migration connection 12 existing between the guard track 24 and the first 14 and/or second 16 electrically conductive elements (see FIG. 2). In that event, the microcontroller processor 38 may transmit a signal to the microcontroller output 40, which may in turn generate signal 28.

As seen in FIG. 3B, the electrical characteristic supervisor 26 may alternatively comprise a window comparator 26b in which the detected voltage VD 34 (see FIG. 2) is provided as an input to comparators 42, 44 for comparison to a high threshold voltage value 46 and a low threshold voltage value 48, which may represent a range for the desired or expected normal condition voltage of the guard track 24. When the value of the detected voltage VD 34 is greater than the high voltage threshold value 46 or less than the low voltage threshold value 48 (i.e., the value of the detected voltage VD 34 is outside the window between the high threshold voltage value 46 and the low threshold voltage value 48), the window comparator may generate signal 28. Once again, depending on the value of the abnormal condition voltage in comparison to the expected normal condition voltage, the signal 28 may be indicative of electro-migration occurring between the first 14 and second 16 electrically conductive elements, a short circuit having occurred between the first 14 and second 16 electrically conductive elements, and/or the location of such electro-migration or short circuit in the region 22 between the first 14 and second 16 electrically conductive elements.

As previously described, the electrical characteristic of the first 14 and second 16 electrically conductive elements may comprise voltage or current. As a result, as also previously described, the electrical characteristic supervisor 26 may comprise a voltage or current supervisor or detector. In that same regard, while the microcontroller 26a and window comparator 26b depicted in FIGS. 3A and 3B are configured or implemented utilizing voltage as the electrical characteristic of the first 14 and second 16 electrically conductive elements, the microcontroller 26a and window comparator 26b may alternatively be configured or implemented utilizing current as the electrical characteristic of the first 14 and second 16 electrically conductive elements. As previously described, other characteristics might be signal frequency or shape in the case of a complex signal generation, instead of the basic voltage divider.

The microcontroller 26a of FIG. 3A and the window comparator 26b of FIG. 3B thus may provide for either a software or hardware generated warning of electro-migration. In that regard, as described herein in connection with FIGS. 2, 4 and 5, depending on the value of the abnormal condition voltage (or current) in comparison to the expected normal condition voltage (or current), the warning and/or signal 28 may be indicative of electro-migration occurring between the first 14 and second 16 electrically conductive elements, a short circuit having occurred between the first 14 and second 16 electrically conductive elements, and/or the location of such electro-migration or short circuit in the region 22 between the first 14 and second 16 electrically conductive elements.

Figure 4:
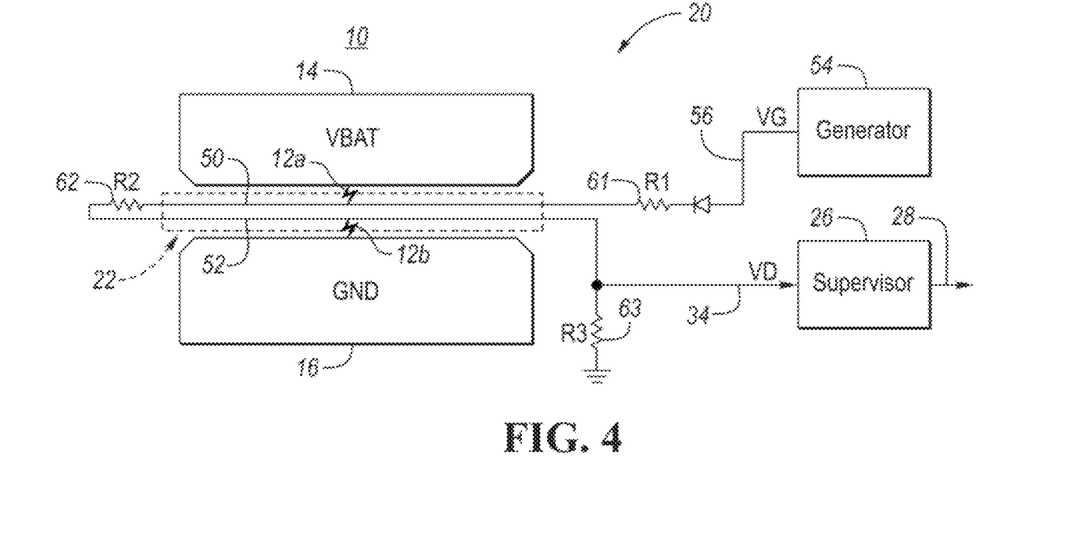
FIG. 4 is simplified schematic diagram of a circuit for detection and warning of electro-migration in a region on a printed circuit board between electrically conductive elements according to a non-limiting exemplary embodiment of the present disclosure.

Referring next to FIG. 4, a simplified schematic diagram is shown of a circuit 20 for detection and warning of electro-migration in a region 22 on a PCB between electrically conductive elements 14, 16 according to another non-limiting exemplary embodiment of the present disclosure. As seen therein, the circuit 20 is provided for detection and warning of electro-migration in an area, space, or region 22 on a PCB 10 between a first electrically conductive element 14 and a second electrically conductive element 16. Here again, it should be noted that the region 22 as illustrated in FIG. 4 is provided for ease of understanding only, and that the region 22 may comprise all or any portion or part of the space or area between the first 14 and second 16 electrically conductive elements.

As seen in FIG. 4, the circuit 20 may comprise a first electrically conductive signal or guard track 50 located in the region 22 between the first 14 and second 16 electrically conductive elements, with the first guard track 50 being electrically isolated from the first 14 and second 16 electrically conductive elements. The circuit 20 may further comprise a second electrically conductive signal or guard track 52 located in the region 22 between the first 14 and second 16 electrically conductive elements, with the second guard track 52 being electrically isolated from the first 14 and second 16 electrically conductive elements. The circuit 20 may further comprise an electrical characteristic generator 54 in electrical communication with the first guard track 50 and configured to generate a reference electrical characteristic. In that regard, as seen in FIG. 4, where the electrical characteristic is depicted a voltage, the electrical characteristic generator 54 is a voltage generator that generates a reference voltage VG 56, which may be a digital output of a microcontroller (e.g., 0-5 Volts).

The circuit 20 may still further comprise an electrical characteristic supervisor 26 in electrical communication with the second guard track 52 and configured to detect an electrical characteristic of the second guard track 52. In that regard, it should be noted that the detected electrical characteristic of the second guard track 52 also reflects any affect on the electrical characteristic of the first guard track 50. In the absence of an electro-migration connection 12a occurring between the first 50 guard track and the first electrically conductive element 14 and an electro-migration connection 12b occurring between the second guard track 52 and the second 16 electrically conductive elements, the second guard track 52 may have a normal condition electrical characteristic based on the reference electrical characteristic 56. In response to electro-migration creating an electrical connection 12a of the first guard track 50 to the first electrically conductive element 14 or creating an electrical connection 12b of the second guard track 52 to the second electrically conductive element 16, the second guard track 52 has an abnormal condition electrical characteristic different than the normal condition electrical characteristic. In response to detecting the abnormal condition electrical characteristic of the guard track 52, the electrical characteristic supervisor 26 is further configured to effectuate a warning to a user of electro-migration in the region 22 between the first 14 and second 16 electrically conductive elements, which may comprise outputting a signal 28. Once again, such a warning and/or signal 28 may be of any type or take any form, such as a message transmitted through a communication interface (not shown), a Diagnostic Trouble Code (DTC) stored in a Non-Volatile Memory (NVM) (not shown), a signal generating such a DTC or causing such a DTC to be generated, or a signal storing such a DTC in NVM or causing such a DTC to be stored in NVM.

As depicted in in FIG. 4, the first electrically conductive element 14 may comprise a voltage supply, such as a battery voltage supply area (VBAT) on the PCB 10. The second electrically conductive element 16 may comprise a ground, such as a ground area (GND) on the PCB 10. It should be noted, however, that alternatively the first 14 and second 16 electrically conductive elements may both or individually comprise any type of electrically conductive element, such as an electrically conductive portion line, lead, trace, track, node, or via. In that regard, where the first eclectically conductive element 14 comprises an electrically conductive via, the first 50 and second 52 electrically conductive guard tracks may be configured as concentric rings surrounding the via and the second electrically conductive element 16 may be configured to surround both the guard tracks 50, 52 and the via, with electrical connections for the first 50 and second 52 guard track rings and the electrically conductive via element 14 configured at another layer of the PCB 10.

As also depicted in FIG. 4, the electrical characteristic of the first 14 and second 16 electrically conductive elements may comprise voltage, the electrical characteristic generator 54 may comprise a voltage generator, and the reference electrical characteristic may comprise a reference voltage VG 56. In that same regard, the electrical characteristic supervisor 26 may comprise a voltage supervisor or detector, the normal condition electrical characteristic of the guard track 52 may comprise a normal condition voltage, and the abnormal condition electrical characteristic of the guard track 52 may comprise an abnormal condition voltage.

It should be noted, however, that the electrical characteristic of the first 14 and second 16 electrically conductive elements may comprise voltage, while the electrical characteristic generator 54 may comprise a current generator, and the reference electrical characteristic may comprise a reference current. In that same regard, the electrical characteristic supervisor 26 may comprise a current supervisor or detector, the normal condition electrical characteristic of the second guard track 52 may comprise a normal condition current, and the abnormal condition electrical characteristic of the second guard track 52 may comprise an abnormal condition current, or signal frequency or shape as well in the case of a complex signal being used as previously described. Furthermore, any of the resistors R1 61, R2 62, and R3 63 shown in FIG. 4 and described in connection therewith, may alternatively be capacitors for example, or impedances more generally.

Referring still to FIG. 4, the circuit 20 may further comprise one or more resistors, R1 61, R2 62, and R3 33, which may be configured as a voltage divider to produce a desired normal condition voltage of the second guard track 52, i.e., the voltage of the second guard track 52 in the absence of an electro-migration connection 12a occurring between the first guard track 50 and the first electrically conductive element 14 and an electro-migration connection 12b occurring between the second guard track 52 and the second electrically conductive element 16. In that regard, to reduce electro-migration effect between the first 14 and second 16 electrically conductive elements, where the first electrically conductive element 14 has a first voltage and the second electrically conductive element has a second voltage less than the first voltage, the voltage generator 54 may be configured to generate a reference voltage between the first and second voltages. The normal condition voltage of the second guard track 52 may also be implemented as an intermediate voltage, i.e., less than the first voltage of the first electrically conductive element 14 and greater than the second voltage of the second electrically conductive element 16.

As previously described, the electrical characteristic supervisor 26 is configured to detect an electrical characteristic of the second guard track 52. In the absence of an electro-migration connection 12a occurring between the first guard track 50 and the first electrically conductive element 14 and an electro-migration connection 12b occurring between the second guard track 52 and the second electrically conductive element 16, the electrical characteristic supervisor 26 detects the normal condition characteristic of the second guard track 52. In response to electro-migration creating an electrical connection 2a of the first guard track 50 to the first electrically conductive element 14 and/or an electrical connection 12b of the second guard track 52 to the second electrically conductive element 16, the electrical characteristic supervisor 26 detects an abnormal condition electrical characteristic of the second guard track 52 different than the normal condition electrical characteristic of the second guard track 52. As seen in FIG. 4, where the electrical characteristic is depicted as voltage, the electrical characteristic supervisor 26 detects voltage VD 34 of the second guard track 52, which may be the normal condition voltage or an abnormal condition voltage of the second guard track 52, depending on the absence or presence of an electro-migration connection 12a, 12b.

In that regard, implemented as shown in FIG. 4, the normal condition voltage may be determined as $VD_n = VG*R3/(R1+R2+R3)$. As a result of electro-migration creating an electrical connection 12a of the first guard track 50 to the first electrically conductive element 14, an abnormal condition voltage may be determined as $VD_{a1}=VBAT*R3/(R2+R3)$. Thus, an electrical connection 12a of the first guard track 50 to the first electrically conductive element 14 causes the value of the voltage VD 34 detected by the supervisor 26 to increase. As a result of electro-migration creating an electrical connection 12b of the second guard track 52 to the second electrically conductive element 16, an abnormal condition voltage may be determined as $VD_{a2}=0$ V. Thus, an electrical connection 12b of the second guard track 52 to the second electrically conductive element 16 causes the value of the voltage VD 34 detected by the supervisor 26 to decrease. As a result of electro-migration creating an electrical connection 12a of the first guard track 50 to the first electrically conductive element 14 and creating an electrical connection 12b of the second guard track 52 to the second electrically conductive element 16 (i.e., "double migration"), the value of the voltage VD 34 detected by the supervisor 26 decreases but resistor R2 62 still limits the anomalous current flow and the warning of electro-migration will always be generated long before failure (i.e., a complete short-circuit).

As also previously described, in response to detecting the abnormal condition electrical characteristic of the second guard track 52, the electrical characteristic supervisor 26 is further configured to effectuate a warning to a user of electro-migration in the region 22 between the first 14 and second 16 electrically conductive elements, which may comprise outputting a signal 28. Thus, once again, any electro-migration in the region 22 between the first 14 and second 16 electrically conductive elements will change the impedance balance at VD, thus enabling a warning signal to be generated prior to the occurrence of a complete short-circuit.

In that regard, where the first electrically conductive element 14 has a first voltage and the second electrically conductive element 16 has a second voltage less than the first voltage, the voltage generator 54 may again be configured to generate a reference voltage having a value between the first and second voltages. The normal condition voltage of the second guard track 52 may also be implemented as an intermediate voltage, i.e., less than the first voltage of the first electrically conductive element 14 and greater than the second voltage of the second electrically conductive element 16. In response to electro-migration creating an electrical connection 12a of the first guard track 50 to the first electrically conductive element 14, the second guard track 52 may then exhibit an abnormal condition voltage greater than the normal condition voltage thereof. In response to electro-migration creating an electrical connection 12b of the second guard track 52 to the second electrically conductive element 16, the second guard track 52 may then exhibit an abnormal condition voltage greater than the normal condition voltage thereof. In response to electro-migration creating an electrical connection 12a of the first guard track 50 to the first electrically conductive element 14 and creating an electrical connection 12b of the second guard track 52 to the second electrically conductive element 16, the second guard track 52 may then exhibit an abnormal condition voltage less than the normal condition voltage thereof.

Figure 5:
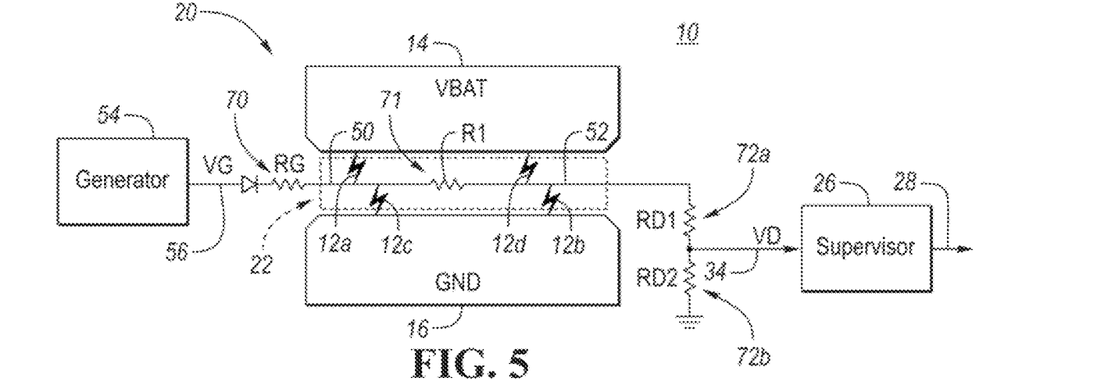
FIG. 5 is simplified schematic diagram of a circuit for detection and warning of electro-migration in a region on a printed circuit board between electrically conductive elements according to a non-limiting exemplary embodiment of the present disclosure.

Referring now to FIG. 5, a simplified schematic diagram is shown of a circuit 20 for detection and warning of electro-migration in a region 22 on a PCB between electrically conductive elements 14, 16 according to yet another non-limiting exemplary embodiment of the present disclosure. As seen therein, the circuit 20 is provided for detection and warning of electro-migration in an area, space, or region 22 on a PCB 10 between a first electrically conductive element 14 and a second electrically conductive element 16. Here again, it should be noted that the region 22 as illustrated in FIG. 5 is provided for ease of understanding only, and that the region 22 may comprise all or any portion or part of the space or area between the first 14 and second 16 electrically conductive elements.

As seen in FIG. 5, the circuit 20 may comprise a first electrically conductive guard track 50 located in the region 22 between the first 14 and second 16 electrically conductive elements, with the first guard track 50 being electrically isolated from the first 14 and second 16 electrically conductive elements. The circuit 20 may further comprise a second electrically conductive guard track 52 located in the region 22 between the first 14 and second 16 electrically conductive elements, with the second guard track 52 being electrically isolated from the first 14 and second 16 electrically conductive elements. As also seen therein, the first 50 and second 52 guard tracks may be connected to each other in the region 22 by a resistor R1 71.

The circuit 20 may further comprise an electrical characteristic generator 54 in electrical communication with the first guard track 50 and configured to generate a reference electrical characteristic. Once again, to reduce electro-migration effect between the first 14 and second 16 electrically conductive elements, where the first electrically conductive element 14 has a first voltage and the second electrically conductive element has a second voltage less than the first voltage, the voltage generator 54 may be configured to generate a reference voltage between the first and second voltages. The normal condition voltage of the second guard track 52 may also be implemented as an intermediate voltage, i.e., less than the first voltage of the first electrically conductive element 14 and greater than the second voltage of the second electrically conductive element 16.

The circuit 20 may still further comprise an electrical characteristic supervisor 26 in electrical communication with the second guard track 52 and configured to detect an electrical characteristic of the second guard track 52. In the absence of an electro-migration connection 12a occurring between the first 50 guard track and the first electrically conductive element 16, and the absence of an electro-migration connection 12b occurring between the second guard track 52 and the second electrically conductive element 16, and the absence of an electrical connection 12c occurring between the first guard track 50 and the second electrically conductive element 16, and the absence of an electrical connection 12d occurring between the second guard track 52 and the first electrically conductive element 14, the second guard track 52 may have a normal condition electrical characteristic based on the reference electrical characteristic 56. In response to electro-migration creating an electrical connection 12a of the first guard track 50 to the first electrically conductive element 14, or electro-migration creating an electrical connection 2b of the second guard track 52 to the first electrically conductive element 16, or electro-migration creating an electrical connection 12c of the first guard track 50 to the second electrically conductive element 16, or electro-migration creating an electrical connection 12d of the second guard track 52 to the first electrically conductive element 14, the second guard track 52 has an abnormal condition electrical characteristic different than the normal condition electrical characteristic. In response to detecting the abnormal condition electrical characteristic of the guard track 52, the electrical characteristic supervisor 26 is further configured to effectuate a warning to a user of electro-migration in the region 22 between the first 14 and second 16 electrically conductive elements, which may comprise outputting a signal 28. Once again, such a warning and/or signal 28 may be of any type or take any form, such as a message transmitted through a communication interface (not shown), a Diagnostic Trouble Code (DTC) stored in a Non-Volatile Memory (NVM) (not shown), a signal generating such a DTC or causing such a DTC to be generated, or a signal storing such a DTC in NVM or causing such a DTC to be stored in NVM.

As depicted in in FIG. 5, the first electrically conductive element 14 may comprise a voltage supply, such as a battery voltage supply area (VBAT) on the PCB 10. The second electrically conductive element 16 may comprise a ground, such as a ground area (GND) on the PCB 10. It should be noted, however, that alternatively the first 14 and second 16 electrically conductive elements may both or individually comprise any type of electrically conductive element, such as an electrically conductive portion line, lead, trace, track, node, or via. In that regard, where the first electrically conductive element 14 comprises an electrically conductive via, the first 50 and second 52 electrically conductive guard tracks may be configured as a ring surrounding the via and the second electrically conductive element 16 may be configured to surround both the guard tracks 50, 52 and the via, with electrical connections for the first 50 and second 52 guard track rings and the electrically conductive via element 14 configured at another layer of the PCB 10.

It should be noted that usually the electrical characteristic of the first 14 and second 16 electrically conductive elements may comprise voltage, the electrical characteristic generator 54 may comprise a voltage generator, and the reference electrical characteristic may comprise a reference voltage. In that same regard, the electrical characteristic supervisor 26 may comprise a voltage supervisor or detector, the normal condition electrical characteristic of the guard track 52 may comprise a normal condition voltage, and the abnormal condition electrical characteristic of the guard track 52 may comprise an abnormal condition voltage.

As previously described, the circuit 20 may comprise one or more resistors, such as resistors RG 70, R1 71, RD1 72a, RD2 72b, which may be configured to produce a desired normal condition voltage of the guard track 52, i.e., the voltage of the guard track 52 in the absence of an electro-migration connection 12a occurring between the first guard track 50 and the first electrically conductive element 14, and the absence of an electro-migration connection 12b occurring between the second guard track 52 and the second electrically conductive element 16, and the absence of an electro-migration connection 12c occurring between the first guard track 50 and the second electrically conductive element 16, and the absence of an electro-migration connection 12d occurring between the second guard track 52 and the first electrically conductive element 14.

As also previously described, the electrical characteristic supervisor 26 is configured to detect an electrical characteristic of the second guard track 52. In the absence of an electro-migration connection 12a occurring between the first guard track 50 and the first electrically conductive element 14, and the absence of an electro-migration connection 12b occurring between the second guard track 52 and the second electrically conductive element 16, and the absence of an electrical connection 12c occurring between the first guard track 50 and the second electrically conductive element 16, and the absence of an electrical connection 12d occurring between the second guard track 52 and the first electrically conductive element 14, the electrical characteristic supervisor 26 detects the normal condition characteristic of the second guard track 52. In response to electro-migration creating an electrical connection 12a of the first guard track 50 to the first electrically conductive element 14, or creating an electrical connection 12b of the second guard track 52 to second electrically conductive element 16, or creating an electrical connection 12c of the first guard track 50 to the second electrically conductive element 16, or creating an electrical connection 12d of the second guard track 52 to the first electrically conductive element 14, the electrical characteristic supervisor 26 detects an abnormal condition electrical characteristic of the second guard track 52 different than the normal condition electrical characteristic of the second guard track 52. As seen in FIG. 5, the electrical characteristic supervisor 26 detects voltage of the second guard track 52, which may be the normal condition voltage or an abnormal condition voltage of the second guard track 52, depending on the absence or presence of an electro-migration connection 12a, 12b, 12c, 12d. As previously described, in response to detecting the abnormal condition electrical characteristic (e.g., voltage) of the second guard track 52, the electrical characteristic supervisor 26 is further configured to effectuate a warning to a user of electro-migration in the region 22 between the first 14 and second 16 electrically conductive elements, which may comprise outputting a signal 28.

Referring still to FIG. 5, as previously described, the first 50 and second 52 guard tracks may be connected in the region 22 between the first 14 and second 16 electrically conductive elements by a resistor R1 71. With such a configuration, the value of the abnormal condition electrical characteristic of the second guard track 52 may then be indicative of a location in the region 22 between the first 14 and second 16 electrically conductive elements of the occurrence of an electrical connection 12a, 12b, 12c, 12d created by electro-migration. More specifically, a first value of the abnormal condition electrical characteristic of the second guard track 52 may be indicative of a first location of an electrical connection 12a created by electro-migration in the region 22 between the first 14 and second 16 electrically conductive elements (i.e., in the region 22 on the generator 54 side of the resistor R1 71). Moreover, a second value of the abnormal condition electrical characteristic of the second guard track 52 different than the first value may be indicative of a second location of an electrical connection 12d created by electro-migration different than the first location in the region 22 between the first 14 and second 16 electrically conductive elements (i.e., in the region 22 on the supervisor 26 side of the resistor R171). Still further, a third value of the abnormal condition electrical characteristic of the second guard track 52 different than the first and second values may be indicative of a third location of an electrical connection 12b or 12c created by electro-migration different than the first and second location in the region 22 between the first 14 and second 16 electrically conductive elements. In that regard, if the voltage VG 56 output by the generator 54 is VBAT, the voltage VD 34 detected by the supervisor 26 in the normal condition may be determined as $VD_n = VBAT*RD2/(RG+R1+RD1+RD2)$. In a first abnormal condition due to occurrence of electro-migration connection 12a, the voltage VD 34 detected by the supervisor 26 may be determined as $VD_{a1} = VBAT*RD2/(R1+RD1+RD2)$. In a second abnormal condition due to occurrence of electro-migration connection 12d, the voltage VD 34 detected by the supervisor 26 may be determined by $VD_{a2} = VBAT*RD2/(RD1+RD2)$. In a third abnormal condition due to occurrence of electro-migration connection 12b or 12c, the voltage VD 34 detected by the supervisor 26 will be $VD_{a3} = 0$. It should be noted that, by locating the first 50 and second 52 guard tracks closer to the first electrically conductive element 14 in the region 22, this third abnormal condition voltage value ($VD_{a3}=0$) will have much lower probability of occurrence than the two other abnormal condition voltage values ($VD_{a1}$, $VD_{a2}$). Alternatively, when the guard track 50 is located in the region 22 closer to electrically conductive element 14 and the guard track 52 is located in the region 22 closer to electrically conductive element 16 (for example with the width of resistor R1 71 closing the gap between), the possibility of electro-migration connections 12*c* and 12*d* might be lower than that of electro-migrations connections 12*a* and 12*b*.

It should also be noted that a serialized set of guard tracks ($GT_i$) and resistors ($R_i$) could be configured (e.g., $GT_1$-$R_1$-$GT_2$-$R_2$-$GT_3$-$R_3$- . . . -$R_N$-$GT_{N+1}$) as part of a single detection and warning circuit or system to cover different regions between different sets of first and second electrically conductive elements. In such an embodiment, the resistors R1, R2, R3, . . . , $R_N$ may be located within or outside the regions between the different sets of first and second electrically conductive elements. In the event of electro-migration between a set of first of second electrically conductive elements, the specific value of the abnormal condition electrical characteristic (e.g., voltage drop value) detected by the electrical characteristic supervisor 26 would enable the particular location of the anomaly to be identified.

Figure 6A:
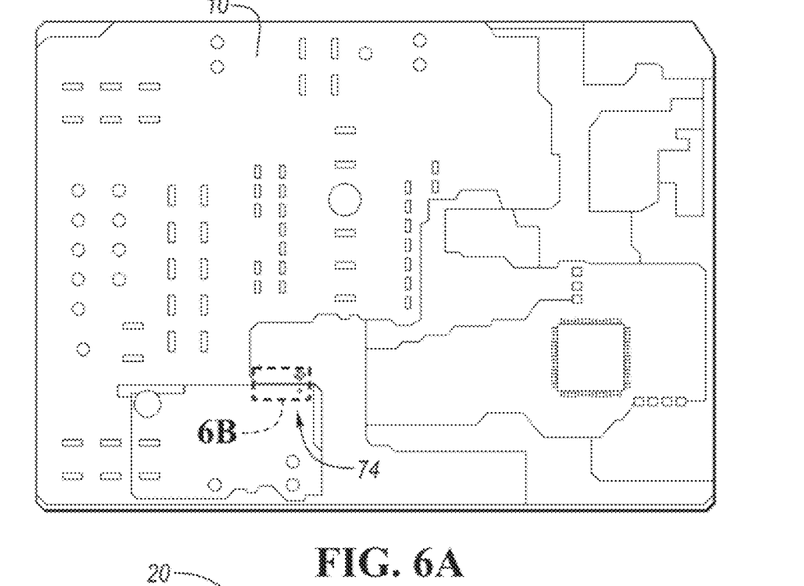
FIG. 6A is an illustration of an exemplary printed circuit board having a circuit for detection and warning of electro-migration in a region on a printed circuit board between electrically conductive elements according to a non-limiting exemplary embodiment of the present disclosure.
Figure 6B:
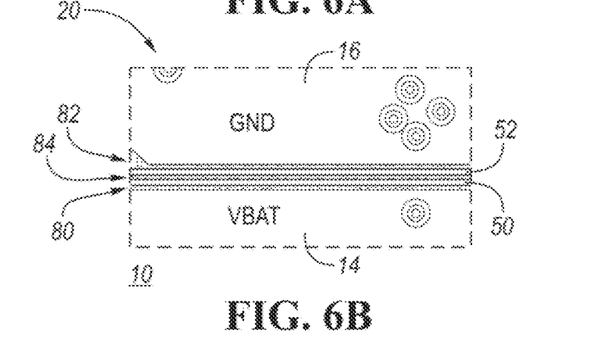
FIG. 6B is a magnified view of a section of the printed circuit board of FIG. 6A illustrating a portion of a circuit for detection and warning of electro-migration in a region on a printed circuit board between electrically conductive elements according to a non-limiting exemplary embodiment of the present disclosure.

FIG. 6A is an illustration of an exemplary PCB 10 having a circuit 20 for detection and warning of electro-migration in a region on the PCB 10 between electrically conductive elements according to a non-limiting exemplary embodiment of the present disclosure. FIG. 6B is a magnified view of a section 74 of the PCB 10 of FIG. 6A illustrating a non-limiting exemplary embodiment of a circuit 20 for detection and warning of electro-migration in a region on the PCB 10 between electrically conductive elements.

As seen in FIG. 6B, first 50 and second 52 electrically conductive guard tracks are located in the area, space, or region between the first 14 and second 16 electrically conductive elements. As depicted in FIG. 6B, the first electrically conductive element 14 may comprise a voltage supply, such as a battery voltage supply area (VBAT) on the PCB 10. The second electrically conductive element 16 may comprise a ground, such as a ground area (GND) on the PCB 10. It should be noted, however, that alternatively the first 14 and second 16 electrically conductive elements may both or individually comprise any type of electrically conductive element, such as an electrically conductive portion, line, lead, trace, track, node, or via.

As also depicted in FIG. 6B, the first guard track 50 is separated from the first electrically conductive element 14 by a non-conductive or insulative space or area 80. Similarly, the second guard track 52 is separated from the second electrically conductive element 16 by a non-conductive or insulative space or area 82. The first 50 and second 52 guard tracks are also separated from each other by a non-conductive or insulative space or area 84. In that regard, the widths of the first 50 and second 52 guard tracks and the spaces 80, 82, 84 may each be 0.15 millimeters. It should be noted, however, that such configurations and dimensions are exemplary only. Other configurations and dimensions may alternatively be employed, which may be different for each guard track 50, 52 and space 80, 82, 84.

The circuits 20 of the present disclosure thus provide systems that improve robustness against electro-migration and short circuit anomalies. The circuits 20 of the present disclosure detect electro-migration and unintended electrical connections and also generate a warning to a user before a short circuit occurs By generating such an early warning, the circuits 20 of the present disclosure mitigate and/or reduce short circuit effects, thereby avoiding risks associated with thermal events. Early warning provided by such circuits 20 reduce short circuit effects and/or prevent the risk of thermal events because the part involved will be serviced before a full short circuit is generated. The circuits 20 also provide such detection and warning of electro-migration and short circuit anomalies, as well as the above-described benefits and advantages associated therewith, for only a negligible increase in cost, having only a few resistors and a transistor in certain implementations.

As is readily apparent from the foregoing, various non-limiting embodiments of a circuit for detection and warning of electro-migration in a region on a printed circuit board between electrically conductive elements have been described. While various embodiments have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A circuit for detection and warning of electro-migration in a region on a printed circuit board between a first electrically conductive element and a second electrically conductive element, the first conductive element having a first electrical characteristic and the second conductive element having a second electrical characteristic different than the first electrical characteristic, the circuit comprising:
   an electrically conductive guard track located in the region between the first and second electrically conductive elements, wherein the electrically conductive guard track is electrically isolated from the first and second electrically conductive elements in the region between the first and second electrically conductive elements, and wherein the electrically conductive guard track has a normal condition electrical characteristic based on the first and second electrical characteristics; and
   an electrical characteristic supervisor in electrical communication with the electrically conductive guard track and configured to detect an electrical characteristic of the electrically conductive guard track;
   wherein, in response to electro-migration creating an electrical connection of the electrically conductive guard track to the first or second electrically conductive element, the electrically conductive guard track has an abnormal condition electrical characteristic different than the normal condition electrical characteristic; and
   wherein, in response to detecting the abnormal condition electrical characteristic of the electrically conductive guard track, the electrical characteristic supervisor is further configured to effectuate a warning of electro-migration in the region between the first and second electrically conductive elements.

2. The circuit of claim 1 wherein the electrically conductive guard track is located equidistant from the first and second electrically conductive elements.

3. The circuit of claim 1 wherein a distance between the electrically conductive guard track to the first electrically conductive element differs from a distance between the electrically conductive guard track to the second electrically conductive element.

4. The circuit of claim 1 wherein each of the first and second electrically conductive elements comprises an electrically conductive track.

5. The circuit of claim 1 wherein the electrical characteristic supervisor comprises a microcontroller or a comparator.

6. The circuit of claim 1 wherein the electrical characteristic comprises voltage, the electrical characteristic supervisor comprises a voltage detector, the first electrical characteristic comprises a first voltage, the second electrical characteristic comprises a second voltage, the normal condition electrical characteristic comprises a normal condition voltage, and the abnormal condition electrical characteristic comprises an abnormal condition voltage.

7. The circuit of claim 6 wherein the first electrically conductive element comprises a voltage supply and the second electrically conductive element comprises a ground.

8. The circuit of claim 6 wherein the wherein the normal condition voltage is less than the first voltage and greater than the second voltage to reduce electro-migration between the first and second electrically conductive elements.

9. The circuit of claim 6 further comprising a voltage divider configured to produce the normal condition voltage.

10. A circuit for detection and warning of electro-migration in a region on a printed circuit board between a first electrically conductive element and a second electrically conductive element, the circuit comprising:
   a first electrically conductive guard track located in the region between the first and second electrically conductive elements, wherein the first electrically conductive guard track is electrically isolated from the first and second electrically conductive elements;
   a second electrically conductive guard track located in the region between the first and second electrically conductive elements, wherein the second electrically conductive guard track is electrically isolated from the first and second electrically conductive elements;
   an electrical characteristic generator in electrical communication with the first electrically conductive guard track and configured to generate a reference electrical characteristic; and
   an electrical characteristic supervisor in electrical communication with the second electrically conductive guard track and configured to detect an electrical characteristic of the second electrically conductive guard track, wherein the second electrically conductive guard track has a normal condition electrical characteristic based on the reference electrical characteristic;
   wherein, in response to electro-migration creating an electrical connection of the first electrically conductive element to the first electrically conductive guard track or creating an electrical connection of the second electrically conductive element to the first electrically conductive guard track or creating an electrical connection of the first electrically conductive element to the second electrically conductive guard track or creating an electrical connection of the second electrically conductive element to the second electrically conductive guard track, the second electrically conductive guard track has an abnormal condition electrical characteristic different than the normal condition electrical characteristic; and
   wherein, in response to detecting the abnormal condition electrical characteristic of the second electrically conductive guard track, the electrical characteristic supervisor is further configured to effectuate a warning of electro-migration in the region between the first and second electrically conductive elements.

11. The circuit of claim 10 wherein a value of the abnormal condition electrical characteristic is indicative of a location in the region between the first and second electrically conductive elements of an electrical connection created by electro-migration.

12. The circuit of claim 10 wherein a first value of the abnormal condition electrical characteristic is indicative of a first location in the region between the first and second electrically conductive elements of an electrical connection created by electro-migration, and wherein a second value of the abnormal condition electrical characteristic different than the first value is indicative of a second location different than the first location in the region between the first and second electrically conductive elements of an electrical connection created by electro-migration.

13. The circuit of claim 10 wherein each of the first and second electrically conductive elements comprises an electrically conductive track.

14. The circuit of claim 10 wherein the electrical characteristic comprises voltage, the electrical characteristic generator comprises a voltage generator, the reference electrical characteristic comprises a reference voltage, the electrical characteristic supervisor comprises a voltage detector, the normal condition electrical characteristic comprises a normal condition voltage, and the abnormal condition electrical characteristic comprises an abnormal condition voltage.

15. The circuit of claim 14 wherein the first electrically conductive element comprises a voltage supply and the second electrically conductive element comprises a ground.

16. The circuit of claim 14 wherein the first electrically conductive element has a first voltage, the second electrically conductive element has a second voltage less than the first voltage, and the reference voltage is less than the first voltage and greater than the second voltage, and wherein the second electrically conductive guard track has an abnormal condition voltage greater than the normal condition voltage in response to electro-migration creating an electrical connection of the first electrically conductive guard track to the first electrically conductive element.

17. The circuit of claim 14 wherein the first electrically conductive element has a first voltage, the second electrically conductive element has a second voltage less than the first voltage, and the reference voltage is less than the first voltage and greater than the second voltage, and wherein the second electrically conductive guard track has an abnormal condition voltage less than the normal condition voltage in response to electro-migration creating an electrical connection of the second electrically conductive guard track to the second electrically conductive element.

18. The circuit of claim 14 wherein the first electrically conductive element has a first voltage, the second electrically conductive element has a second voltage less than the first voltage, and the reference voltage is less than the first voltage and greater than the second voltage, and wherein the second electrically conductive guard track has an abnormal condition voltage less than the normal condition voltage in response to electro-migration creating an electrical connection of the first electrically conductive guard track to the first electrically conductive element and an electrical connection of the second electrically conductive guard track to the second electrically conductive element.

19. The circuit of claim 14 wherein the first electrically conductive element has a first voltage, the second electrically conductive element has a second voltage less than the first voltage, and the normal condition voltage is less than the first voltage and greater than the second voltage to reduce electro-migration between the first and second electrically conductive elements.

20. The circuit of claim 14 further comprising at least one resistor configured to produce the normal condition voltage.

* * * * *

UNITED STATES PATENT AND TRADEMARK OFFICE
CERTIFICATE OF CORRECTION

PATENT NO. : 11,162,998 B2
APPLICATION NO. : 16/558538
DATED : November 2, 2021
INVENTOR(S) : Federico Giordano et al.

Page 1 of 1

It is certified that error appears in the above-identified patent and that said Letters Patent is hereby corrected as shown below:

In the Claims

Column 17, Line 17, Claim 8:
After "The circuit of claim 6 wherein the"
Delete "wherein the" (second occurrence).

Signed and Sealed this
Twenty-ninth Day of March, 2022

Drew Hirshfeld
*Performing the Functions and Duties of the
Under Secretary of Commerce for Intellectual Property and
Director of the United States Patent and Trademark Office*